United States Patent
Georgiades (10) Patent No.: US 11,984,755 B2
(45) Date of Patent: May 14, 2024

(54) DEVICE FOR CHARGING ELECTRONIC DEVICES AND BOOSTING SIGNALS

(71) Applicant: Molonlave Group LLC, Long Island City, NY (US)

(72) Inventor: Marios Georgiades, Saddle River, NJ (US)

(73) Assignee: Molonlave Group LLC, Long Island City, NY (US)

( * ) Notice: Subject to any disclaimer, the term of this patent is extended or adjusted under 35 U.S.C. 154(b) by 439 days.

(21) Appl. No.: 16/555,248

(22) Filed: Aug. 29, 2019

(65) Prior Publication Data

US 2020/0076216 A1 Mar. 5, 2020

Related U.S. Application Data (60) Provisional application No. 62/724,730, filed on Aug. 30, 2018.

(51) Int. Cl.
*H02J 7/34* (2006.01)
*H01R 24/60* (2011.01)
*H02J 7/00* (2006.01)
*H03F 3/189* (2006.01)
*H04B 1/04* (2006.01)
*H04B 1/40* (2015.01)
*H04B 1/401* (2015.01)

(52) U.S. Cl.
CPC ............. *H02J 7/342* (2020.01); *H01R 24/60* (2013.01); *H02J 7/0042* (2013.01); *H03F 3/189* (2013.01); *H02J 7/00* (2013.01); *H02J 7/00034* (2020.01); *H04B 1/04* (2013.01); *H04B 1/40* (2013.01); *H04B 1/401* (2013.01)

(58) Field of Classification Search
CPC .. H02J 7/342; H02J 7/0042; H02J 7/00; H02J 7/00034; H01R 24/60; H04B 1/04; H04B 1/40; H04B 1/401
USPC .................................... 320/114, 103
See application file for complete search history.

(56) References Cited

U.S. PATENT DOCUMENTS

| | | | | |
|---|---|---|---|---|
| 5,248,264 A | * | 9/1993 | Long ..................... | H01R 13/62 439/929 |
| 5,549,486 A | * | 8/1996 | Cavallaro ............ | H01R 13/639 439/500 |
| 9,761,927 B2 | * | 9/2017 | Kasar ..................... | H01Q 1/243 |
| D814,412 S | | 4/2018 | Georgiades | |
| D816,026 S | | 4/2018 | Georgiades | |
| D816,606 S | | 5/2018 | Georgiades | |

(Continued)

FOREIGN PATENT DOCUMENTS

WO WO-2016159828 A1 * 10/2016

OTHER PUBLICATIONS

RushCharge, "Products—Rush Charge," https://rushcharge.com/collections/all, retrieved Sep. 17, 2018, 4 pages.

*Primary Examiner* — Richard Isla
*Assistant Examiner* — Manuel Hernandez
(74) *Attorney, Agent, or Firm* — Ryan, Mason & Lewis, LLP (57) ABSTRACT

An electronic device includes a connector for connecting to a second electronic device, a battery and an amplifier. The battery is configured for charging a battery of the connected second electronic device, and the amplifier is configured to amplify one or more communication signals. The one or more communication signals are received by and/or transmitted from the connected second electronic device.

20 Claims, 5 Drawing Sheets

(56) References Cited

U.S. PATENT DOCUMENTS

| | | | |
|---|---|---|---|
| 2006/0058071 A1* | 3/2006 | Buren | H04W 52/367 455/571 |
| 2009/0181735 A1* | 7/2009 | Griffin, Jr. | H01Q 1/244 455/575.7 |
| 2010/0151917 A1* | 6/2010 | Wilson | H04M 1/6075 455/571 |
| 2012/0056789 A1* | 3/2012 | Sohn | H01Q 1/44 343/702 |
| 2012/0081069 A1* | 4/2012 | Chen | G06F 1/1632 320/108 |
| 2013/0035090 A1* | 2/2013 | Moshfeghi | H04W 52/46 455/11.1 |
| 2013/0157729 A1* | 6/2013 | Tabe | H04W 52/0245 977/932 |
| 2014/0018016 A1* | 1/2014 | Chang | H04B 15/00 455/90.1 |
| 2014/0065948 A1* | 3/2014 | Huang | H02J 7/0045 361/679.01 |
| 2014/0192481 A1* | 7/2014 | Wojcik | G06F 21/86 361/679.55 |
| 2014/0254326 A1* | 9/2014 | Chang | G08C 23/02 367/197 |
| 2015/0270734 A1* | 9/2015 | Davison | H04B 1/1607 320/103 |
| 2015/0271309 A1* | 9/2015 | Ames | H04W 4/029 455/456.1 |
| 2016/0142867 A1* | 5/2016 | Kim | H02J 7/007 320/108 |
| 2018/0227770 A1* | 8/2018 | Zhan | H04B 7/15542 |
| 2022/0352681 A1* | 11/2022 | Georgiades | H01R 13/6675 |

\* cited by examiner

DEVICE FOR CHARGING ELECTRONIC DEVICES AND BOOSTING SIGNALS

FIELD

The field relates generally to devices used to charge electronic devices and boost communication signals used by electronic devices, such as, for example, portable electronic devices, including but not necessarily limited to, mobile phones, smartphones, and tablets.

BACKGROUND

Portable personal electronic devices have become ubiquitous, and are used by many individuals on a daily basis. Such personal electronic devices may include mobile phones, smartphones, and tablet computers. By 2020, it is predicted that 4.78 billion people will have smartphones worldwide. Individuals use such devices to access a variety of mobile applications such as, social media applications, online video streaming applications, and mobile gaming applications. Portable personal electronic devices typically come equipped with rechargeable battery technology such that a user need not replace the battery after each use. Such battery technology can be recharged using battery chargers, such as, for example, wall outlet chargers and portable charging devices. Such portable charging devices allow a user to have a hands-free use experience while recharging the portable personal electronic device. However, such portable charging devices are typically cumbersome or include a cable connecting the portable personal electronic device and the portable charging device. Therefore, a need exists for implementing a non-cumbersome recharging device that maintains the portability of personal electronic devices.

Portable personal electronic devices typically use communication systems to communicate with other electronic devices, such as, for example, remote computer systems and other portable personal electronic devices. To communicate with other electronic devices, such portable personal electronic devices must receive and transmit communication signals over networks. The signal strength of such communication signals must be great enough such that the signals transmitted to the network and received from the network can be detected and processed. In some instances, such signals cannot be detected and processed for various reasons, such as, for example, physical obstructions that attenuate a communication signal between a portable personal electronic device and a network. Accordingly, a need exists for addressing problems with receipt and transmission of communication signals.

SUMMARY

Illustrative embodiments of the invention provide a portability device configured to perform portable recharging and signal boosting of an electronic device.

According to an embodiment, an electronic device includes a connector for connecting to a second electronic device, a battery and an amplifier. The battery is configured for charging a battery of the connected second electronic device, and the amplifier is configured to amplify one or more communication signals. The one or more communication signals are received by and/or transmitted from the connected second electronic device. The amplifier can be configured to amplify the one or more communication signals in a plurality of frequency ranges.

The connector may comprise, for example, a male micro-USB connector, a male USB-mini connector, a male USB-C connector, or a male lightning connector, and may be integrated with a housing of the electronic device. The charging of the battery of the connected second electronic device and the amplifying of the one or more communication signals are performed via the connector. The electronic device may include one or more additional connectors, wherein the additional connectors comprise a different type connector than the connector for connecting to other electronic devices of a different type than the second electronic device.

The electronic device may be configured for simultaneously performing the charging of the battery of the connected second electronic device and the amplifying of the one or more communication signals.

In accordance with one or more embodiments, the electronic device includes an antenna and one or more transmission/reception components for transmitting and receiving the one or more communication signals to and from a network.

In one or more embodiments, the electronic device transmits the amplified one or more communication signals to a network, and the connected second electronic device receives the amplified one or more communication signals via the network.

The electronic device may amplify the one or more communication signals after reception of the one or more communication signals by the connected second electronic device via a network.

The electronic device may amplify the one or more communication signals prior to transmission of the one or more communication signals by the connected second electronic device over a network.

According to an embodiment, a method includes connecting a charging/signal boosting device to an electronic device via a connector, charging a battery of the connected electronic device, and amplifying one or more communication signals received by and/or transmitted from the connected electronic device. The charging is performed using a battery of the charging/signal boosting device, and the amplifying is performed using an amplifier of the charging/signal boosting device.

The charging and the amplifying can be simultaneously performed, and performed via the connector.

The method can also include transmitting the amplified one or more communication signals from the charging/signal boosting device to a network, wherein the connected electronic device receives the amplified one or more communication signals via the network.

The amplifying can be performed after reception of the one or more communication signals by the connected electronic device via a network, and/or performed prior to transmission of the one or more communication signals by the connected electronic device over a network.

DETAILED DESCRIPTION

A need exists for a non-cumbersome, portable charging device that can recharge portable personal electronic devices while maintaining a hands-free use experience. A need also exists for a non-cumbersome, portable signal boosting device that can boost the communication signals received by and transmitted from a portable personal electronic device. Signal boosting technology enables a portable personal electronic device to boost (e.g., amplify), the strength of a communication signal such that the signal can be detected and processed. As detailed herein, one or more embodiments of the invention allow for a portable electronic device that can perform portable recharging and/or signal boosting of an electronic device.

As used herein, a network, can refer to, but is not necessarily limited to, a local area network (LAN), wide area network (WAN), cellular network, satellite network or the Internet.

Figure 1:
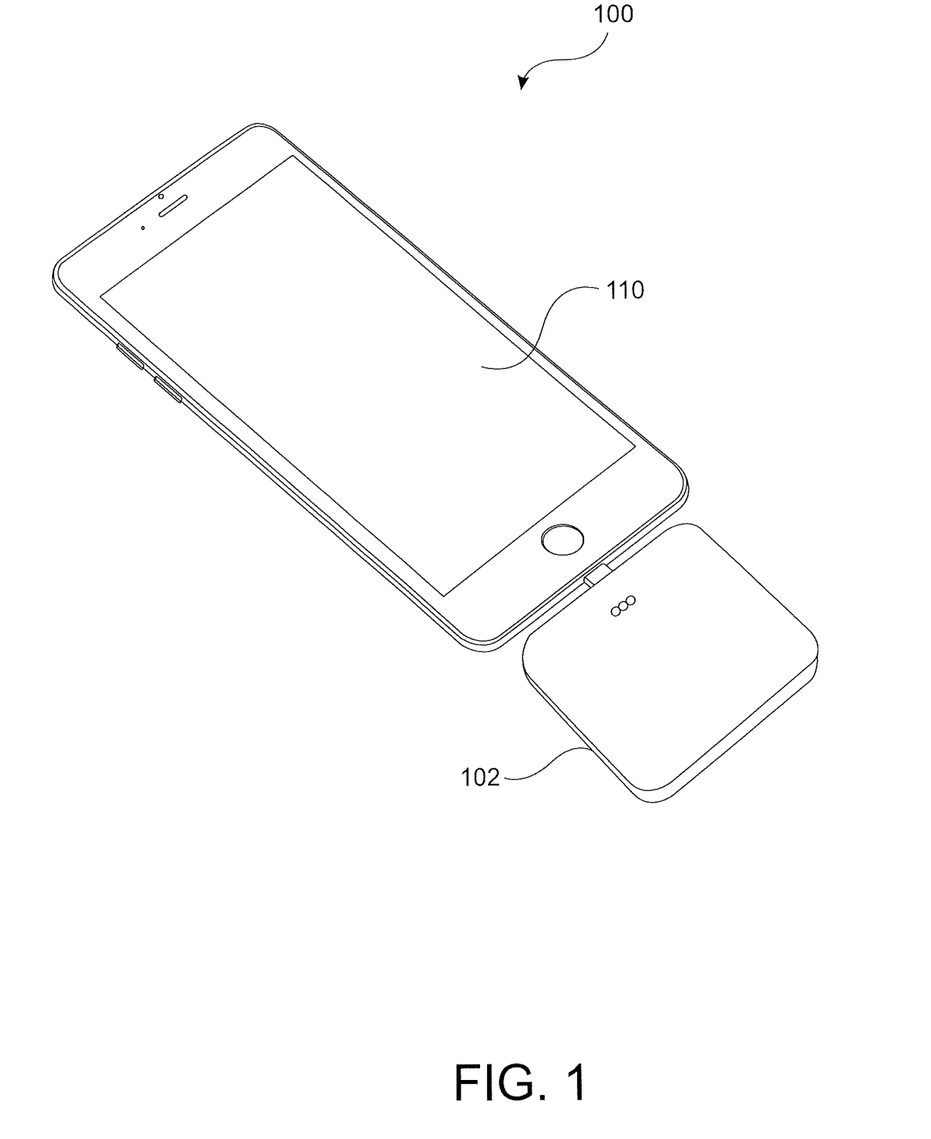
FIG. 1 illustrates a device assembly in accordance with an embodiment of the invention.

FIG. 1 illustrates device assembly 100, which comprises portable recharging and signal boosting device 102 attached to an electronic device 110. Electronic device 110 can be a portable personal electronic device, such as, for example, a mobile phone, smartphone, or tablet. Portable recharging and signal boosting device 102 has the capability of performing at least one of (1) recharging the electronic device 110 and (2) boosting communication signals received by and transmitted from the electronic device 110. Such a configuration allows a user to charge its electronic device 110 while maintaining a hands-free use experience. Such a configuration also allows a user to maintain an adequate communication link between an electronic device 110 and a network by providing a signal boost to amplify communication signals between the electronic device 110 and the network, such that the communication signals can be detected and processed. In an embodiment of the present invention, the portable recharging and signal boosting device 102 maintains the portability features of electronic device 110, such that, in a non-limiting example, the portable recharging and signal boosting device 102 is small enough to fit in one's pocket for storage. For example, the length of the portability device is 2⅛", the width is 2⅛", and the depth is ⅜". However, it is to be understood that the dimensions of the portable recharging and signal boosting device 102 are not limited thereto.

Figure 2A:
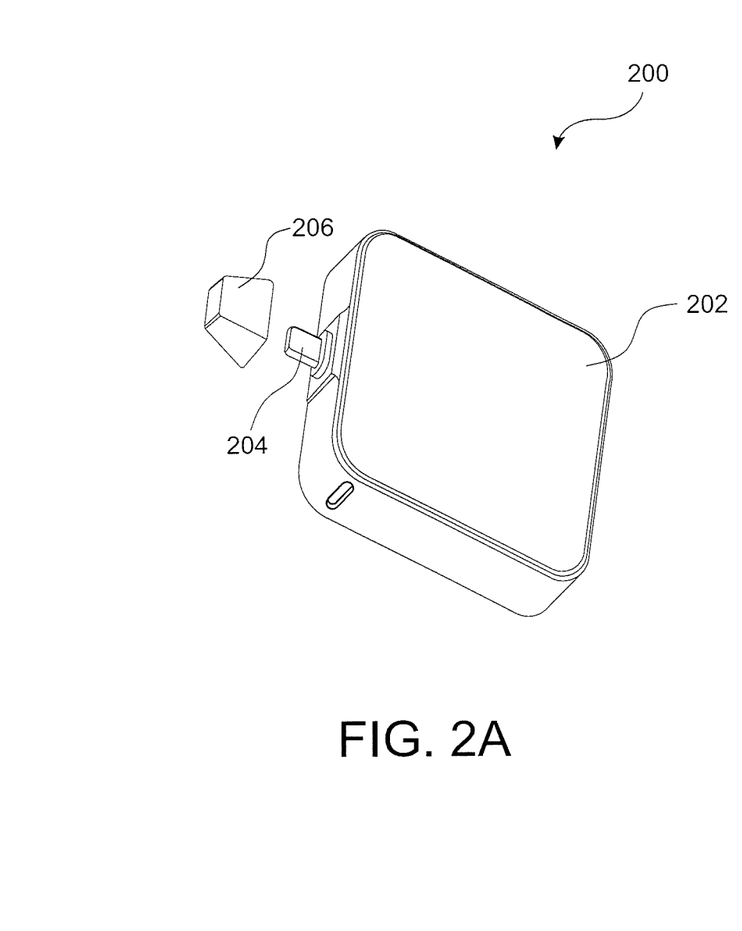
FIGS. 2A and 2B illustrate a portable recharging and signal boosting device in accordance with an embodiment of the invention.
Figure 2B:
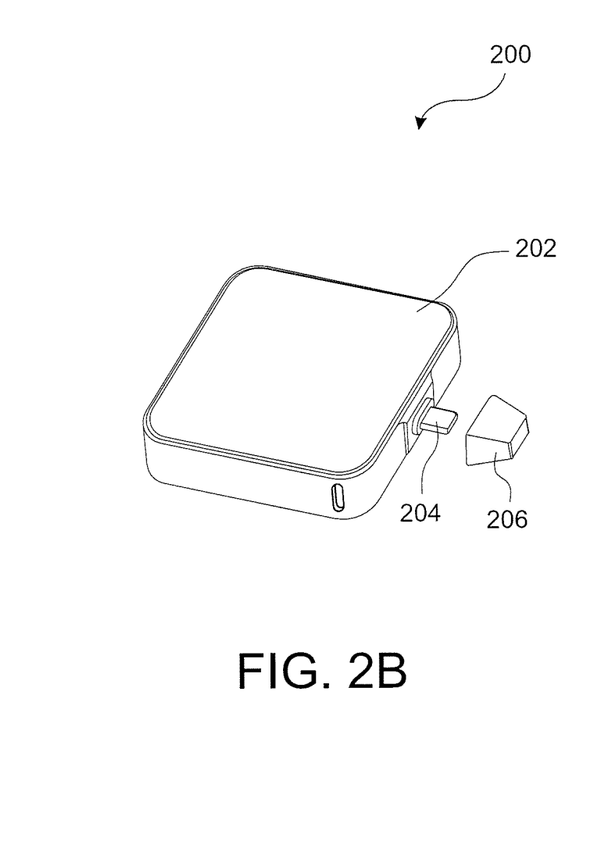

FIGS. 2A and 2B illustrate different views of a portable recharging and signal boosting device 200 in accordance with an embodiment of the invention. Portable recharging and signal boosting device 200 includes a component housing 202, charge port 204, and cap 206.

Portable recharging and signal boosting device 200 is configured such that the charge port 204 provides an electronic device (e.g., electronic device 110) with at least one of portable recharging and signal boosting. By non-limiting example, charge port 204 can be a male micro-USB, USB-mini, USB-C, or Apple® connector (e.g., lightning), or other type of portable device connector, such that the charge port 204 provides an electronic device with at least one of portable recharging and signal boosting. Portable recharging and signal boosting may be simultaneously or individually provided to a connected electronic device by the portable recharging and signal boosting device 200.

Although one charge port 204 is shown, the embodiments of the present invention are not necessarily limited thereto. The device 200 may include more than one charge port 204 respectively with different types of connectors. For example, the device 200 can include a USB type charge port to accommodate Android® operating system portable devices, and an Apple® connector to accommodate Apple® portable devices.

Portable recharging and signal boosting device 200 is configured such that cap 206 mates with charge port 204 for storage purposes and to protect charge port 204 from damage when the portable recharging and signal boosting device 200 is not in use.

The capabilities of the device 200 will depend on the configuration of the components in the component housing 202 and whether they are configured for recharging, signal boosting, or both. Referring to FIG. 2D, component housing 202 internally comprises components necessary for providing portable recharging and/or signal boosting of an electronic device. For portable recharging, the inside of the component housing 202 comprises a battery 230 configured to recharge an electronic device via charge port 204. The battery 230 is configured such that it can be recharged when the portable recharging and signal boosting device 200 is not in use. The battery 230 of the portable recharging and signal boosting device 200 can be recharged using another charger, such as, for example, a wall outlet charger or another portable charger. In accordance with one or more embodiments of the present invention, the battery 230 is configured to be recharged with suitable power requirements, such as, by non-limiting example, recharging with at least 5V and 1.3 A, which would recharge the portable recharging and signal boosting device 200 in approximately 75 minutes. Such a capability allows the portable recharging and signal boosting device 200 to be reused multiple times, such as, for example, over 1,000 times.

According to one or more embodiments of the present invention, the battery 230 of the portable recharging and signal boosting device 200 has a capacity to fully recharge the battery of an electronic device. By non-limiting example, the battery 230 of the portable recharging and signal boosting device 200 can be 1800 mAh, which is enough to recharge a standard smartphone for 8 hours of extended use. The battery 230 of the portable recharging and signal boosting device 200 is configured to recharge an electronic device with suitable power requirements, such as, by non-limiting example, the portable recharging and signal boosting device 200 outputting at least 5V and 1.7 A, which can recharge a standard smartphone in approximately 35 minutes.

Components for providing signal boosting of an electronic device include an amplifier 240 configured to amplify the communication signals received by and transmitted from an electronic device connected to the portable recharging and signal boosting device 200. In accordance with an embodiment of the present invention, the portable recharging and signal boosting device 200 also includes an antenna 250 and transmission/reception components 260 (e.g., transmitter, receiver and/or transceiver) for transmitting and receiving such communication signals. In accordance with one or more embodiments of the present invention, the amplifier 240 is configured to amplify communication signals received via the antenna 250 and transmission/reception components 260 such that an electronic device or network connected to the portable recharging and signal boosting device 200 can receive, detect and process the signals. The amplifier 250 is also configured such that it can amplify communication signals in a variety of frequency ranges, such as, by non-limiting example, frequency ranges for communication signals used for GSM, 3G, 4G LTE, and Wi-Fi.

Figure 2C:
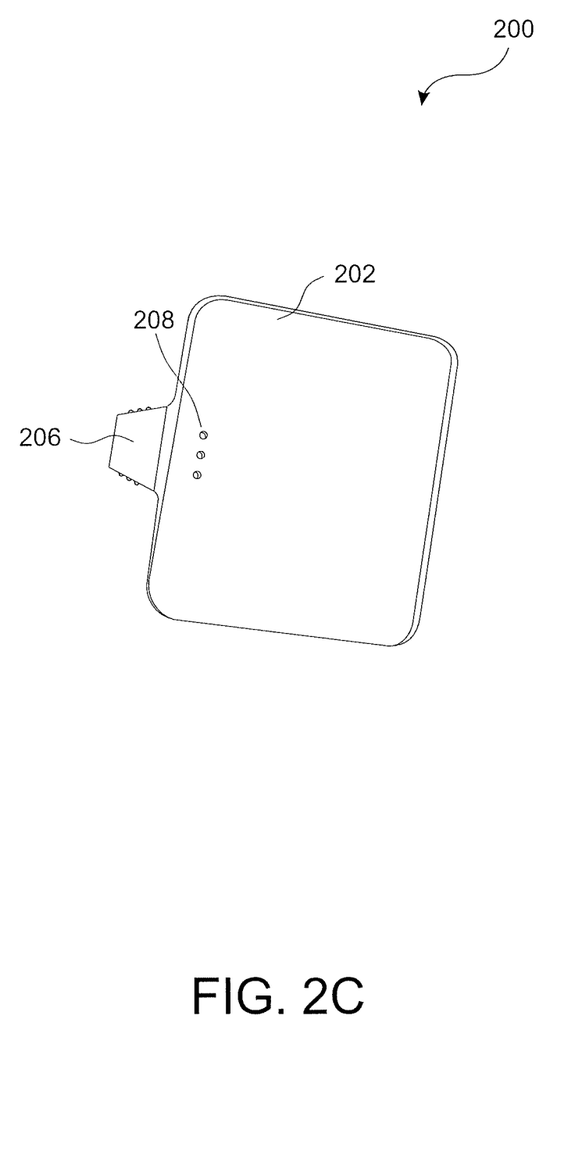
FIG. 2C shows an image of a portable recharging and signal boosting device in accordance with an embodiment of the invention.
Figure 2D:
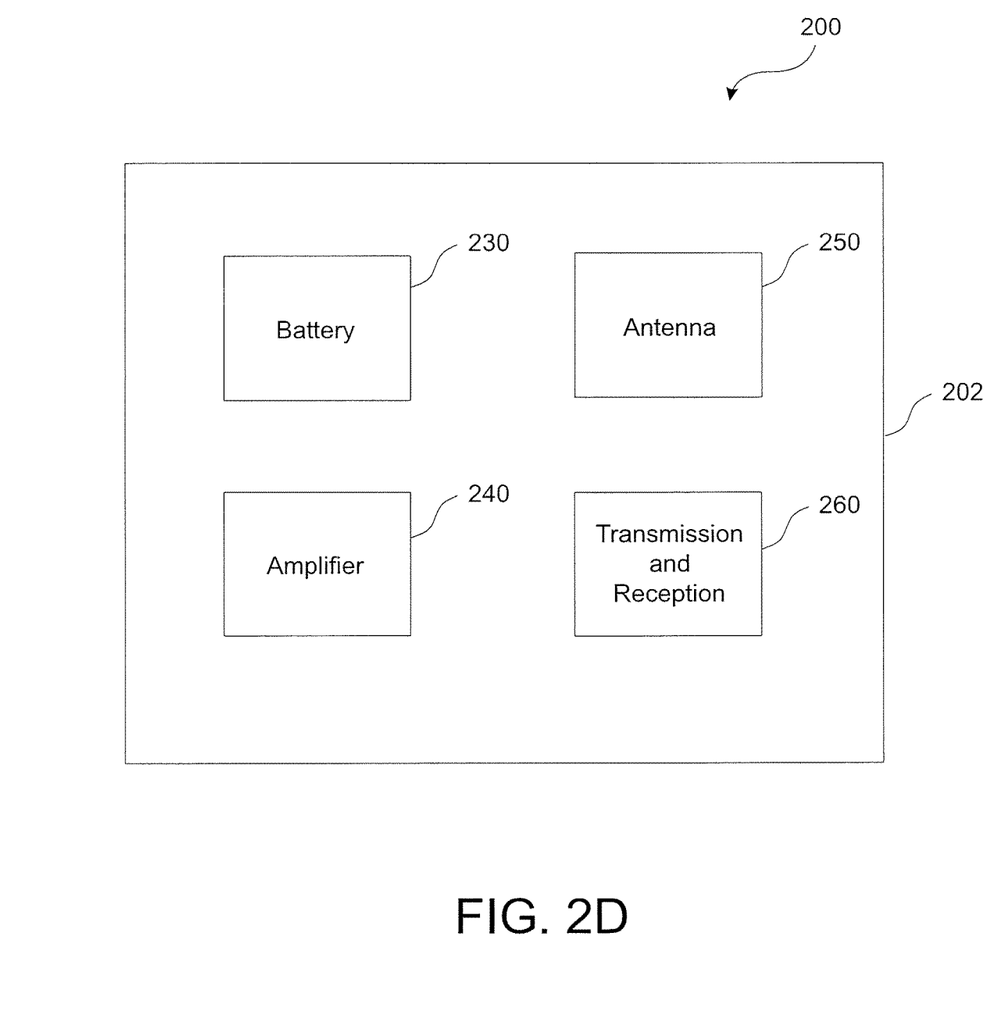
FIG. 2D illustrates a block diagram of a portable recharging and signal boosting device in accordance with an embodiment of the invention.

FIG. 2C shows an image of a portable recharging and signal boosting device 200 configured for storage, which is indicated by cap 206 being positioned to protect the charge port of the device 200. Component housing 202 of the portable recharging and signal boosting device 200 includes an indicator 208 for displaying the charge remaining in the battery of the portable recharging and signal boosting device 200, and whether the battery of the portable recharging and signal boosting device 200 is being charged. Indicator 208 can be a light indicator including, for example, one or more light-emitting diodes (LEDs). In FIG. 2C, indicator 208 comprises three LEDs to indicate the charge remaining in the battery of the portable recharging and signal boosting device 200 and/or whether the battery of the portable recharging and signal boosting device 200 is being charged.

Figure 3:
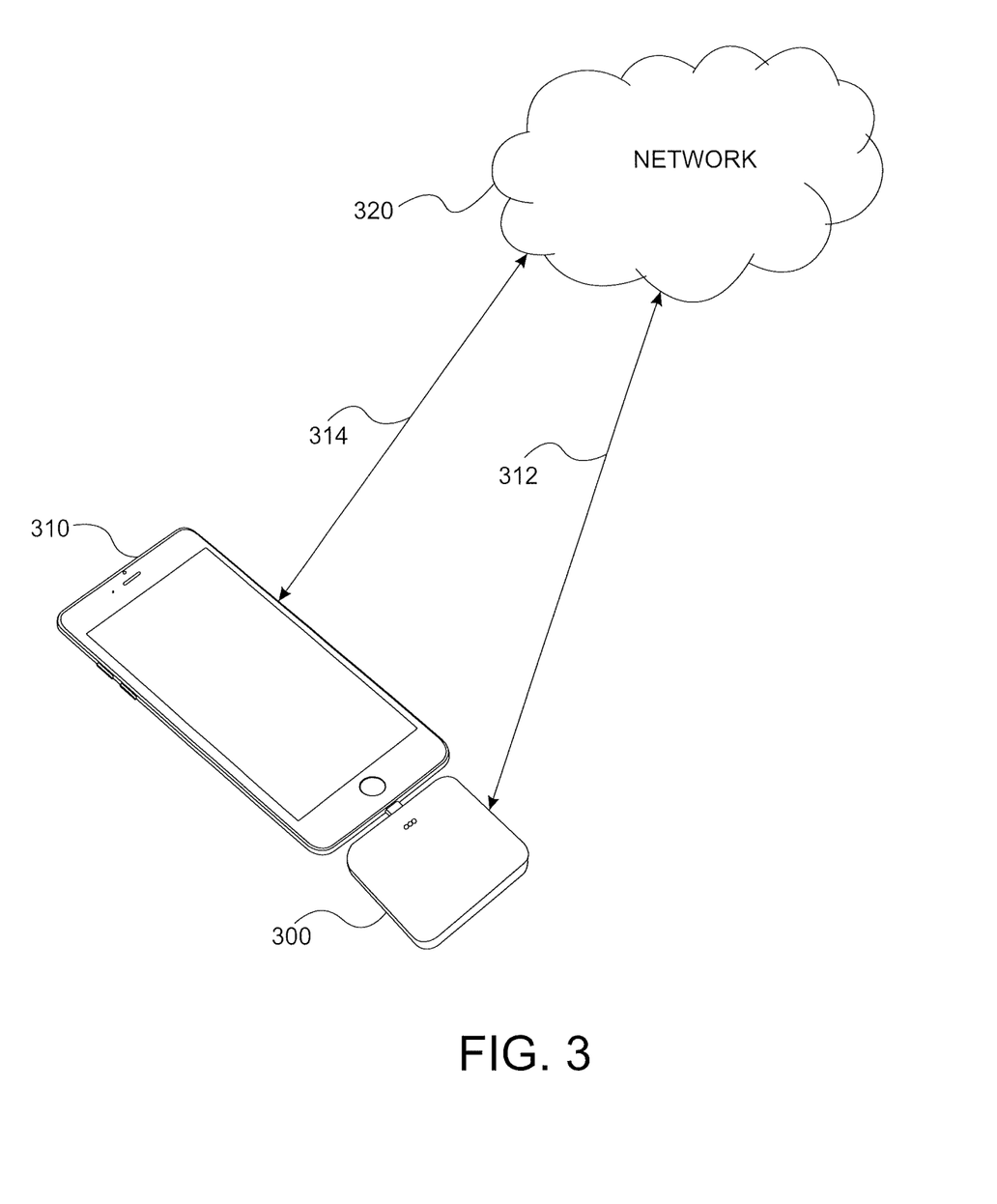
FIG. 3 illustrates a portable recharging and signal boosting device attached to an electronic device and configured to communicate with a network in accordance with an embodiment of the invention.

FIG. 3 illustrates a portable recharging and signal boosting device 300 attached to an electronic device 310 and configured to communicate with a network 320 via communication link 312 comprising, for example, wireless connections via, for example, Wi-Fi, BLUETOOTH, IEEE 802.11, and/or networks, including but not limited to, a local area network (LAN), a wide area network (WAN), cellular networks, ad hoc networks, wireless ad hoc networks (WANETs), satellite networks or the Internet. In accordance with an embodiment of the present invention, portable recharging and signal boosting device 300 receives communication signals from and transmits communication signals to the network 320 via link 312 such that the communication signals that would have been directly received by or transmitted from the electronic device 310 are routed through the portable recharging and signal boosting device 300 for signal boosting capability. The portable recharging and signal boosting device 300 amplifies the signals accordingly such that (1) the electronic device 310 can detect and process signals received and amplified by the portable recharging and signal boosting device 300 via communication link 312; and (2) the network 320 can detect and process amplified signals originated from the electronic device 310, and amplified and transmitted by the portable recharging and signal boosting device 300 to the network 320 via communication link 312. In this case, the portable recharging and signal boosting device 300 would include an antenna and transmission and reception components as discussed herein above.

Alternatively, the portable recharging and signal boosting device 300 does not maintain the communication link 312 with the network 320, and transmission and reception of communication signals are performed via a communication link 314 between the electronic device 310 and the network 320. Similar to communication link 312, communication link 314 comprises, for example, wireless connections via, for example, Wi-Fi, BLUETOOTH, IEEE 802.11, and/or networks, including but not limited to, a LAN, a WAN, cellular networks, ad hoc networks, WANETs, satellite networks or the Internet. In this case, the portable recharging and signal boosting device 300 amplifies communication signals received from and transmitted to the network 320 by the electronic device 310 via link 314. In the alternative embodiment, the portable recharging and signal boosting device 300 amplifies the signals after reception by or prior to transmission by the electronic device 310 via communication link 314.

Although exemplary embodiments of the present invention have been described hereinabove, it should be understood that the present invention is not limited to these embodiments, but may be modified by those skilled in the art without departing from the spirit and scope of the present invention.

What is claimed is:

1. A method, comprising:
    connecting a charging/signal boosting device to an electronic device via a connector integrated with a housing of the charging/signal boosting device such that an entirety of the charging/signal boosting device is configured to be positioned on one side of the electronic device when the charging/signal boosting device is attached to the electronic device via the connector;
    wherein the electronic device is configured to transmit and receive one or more communication signals to and from a given cellular network, and wherein the electronic device comprises one of a smartphone and a tablet;
    charging a battery of the connected electronic device using a battery of the charging/signal boosting device, wherein the charging of the battery of the connected electronic device is performed via the connector;
    amplifying the one or more communication signals at least one of received from the given cellular network by the connected electronic device and transmitted to the given cellular network from the connected electronic device using an amplifier of the charging/signal boosting device, wherein the one or more communication signals to be amplified are received from the connected electronic device via the connector; and
    transmitting amplified ones of the one or more communication signals from the charging/signal boosting device to the connected electronic device via the connector, wherein the connected electronic device transmits the amplified ones of the one or more communication signals to the given cellular network;
    wherein, in connection with the receiving of the one or more communication signals and the transmitting of the amplified ones of the one or more communication signals to the given cellular network, the charging/signal boosting device does not maintain a communication link with the given cellular network.

2. The method according to claim 1, wherein the charging and the amplifying are simultaneously performed.

3. The method according to claim 1, further comprising transmitting additional amplified ones of the one or more communication signals from the charging/signal boosting device to the given cellular network.

4. The method according to claim 3, wherein the connected electronic device receives the additional amplified ones of the one or more communication signals via the given cellular network.

5. The method according to claim 1, wherein the amplifying is performed after reception of the one or more communication signals by the connected electronic device via the given cellular network.

6. The method according to claim 1, wherein the amplifying is performed prior to transmission of the one or more communication signals by the connected electronic device over the given cellular network.

7. The method according to claim 1, further comprising connecting to the given cellular network by the charging/ signal boosting device to receive one or more additional communication signals from the given cellular network, wherein the one or more additional communication signals are for the connected electronic device and routed to the charging/signal boosting device in place of the connected electronic device.

8. An electronic device, comprising:
a connector for connecting to a second electronic device, the second electronic device being configured to transmit and receive one or more communication signals to and from a given cellular network, wherein the second electronic device comprises one of a smartphone and a tablet;
wherein the connector is integrated with a housing of the electronic device such that an entirety of the electronic device is configured to be positioned on one side of the second electronic device when the electronic device is attached to the second electronic device via the connector;
a battery configured for charging a battery of the connected second electronic device; and
an amplifier configured to amplify the one or more communication signals at least one of received from the given cellular network by the connected second electronic device and transmitted to the given cellular network from the connected second electronic device;
wherein the electronic device is configured to: (i) perform the charging of the battery of the connected second electronic device via the connector; (ii) receive from the connected second electronic device via the connector, the one or more communication signals to be amplified; (iii) amplify the one or more communication signals received from the connected second electronic device via the connector; and (iv) transmit amplified ones of the one or more communication signals to the connected second electronic device via the connector, wherein the connected second electronic device transmits the amplified ones of the one or more communication signals to the given cellular network; and
wherein, in connection with the receiving of the one or more communication signals and the transmitting of the amplified ones of the one or more communication signals to the given cellular network, the electronic device does not maintain a communication link with the given cellular network.

9. The electronic device according to claim 8, wherein the connector comprises one of a male micro-USB connector, a male USB-mini connector, a male USB-C connector, and a male lightning connector.

10. The electronic device according to claim 9, wherein the connector protrudes from the housing of the electronic device and separates the housing of the electronic device from the second electronic device when the electronic device is attached to the second electronic device via the connector.

11. The electronic device according to claim 8, wherein the electronic device is configured for simultaneously performing the charging of the battery of the connected second electronic device and the amplifying of the one or more communication signals at least one of received from the given cellular network by the connected second electronic device and transmitted to the given cellular network from the connected second electronic device.

12. The electronic device according to claim 8, further comprising within the housing of the electronic device an antenna and one or more transmission/reception components for transmitting and receiving the one or more communication signals to and from the given cellular network.

13. The electronic device according to claim 8, wherein the amplifier is configured to amplify the one or more communication signals in a plurality of frequency ranges.

14. The electronic device according to claim 8, further comprising one or more additional connectors, wherein the one or more additional connectors comprise a different type connector than the connector.

15. The electronic device according to claim 8, wherein the electronic device transmits additional amplified ones of the one or more communication signals to the given cellular network.

16. The electronic device according to claim 15, wherein the connected second electronic device receives the additional amplified ones of the one or more communication signals via the given cellular network.

17. The electronic device according to claim 8, wherein the electronic device amplifies the one or more communication signals after reception of the one or more communication signals by the connected second electronic device via the given cellular network.

18. The electronic device according to claim 8, wherein the electronic device amplifies the one or more communication signals prior to transmission of the one or more communication signals by the connected second electronic device over the given cellular network.

19. The electronic device according to claim 8, wherein the electronic device is portable.

20. The electronic device according to claim 8, wherein the electronic device is further configured to connect to the given cellular network to receive one or more additional communication signals from the given cellular network, wherein the one or more additional communication signals are for the connected second electronic device and routed to the electronic device in place of the connected second electronic device.

* * * * *